United States Patent
Wang et al.

[19]

[11] Patent Number: 6,086,385
[45] Date of Patent: Jul. 11, 2000

[54] CONNECTOR ASSEMBLY

[75] Inventors: Terry Shing Wang, Irvine; John Steven Szalay, Corona Del Mar, both of Calif.

[73] Assignee: Delphi Technologies, Inc., Troy, Mich.

[21] Appl. No.: 09/306,331

[22] Filed: May 6, 1999

[51] Int. Cl.[7] .............................. H01R 13/62; H05K 1/00
[52] U.S. Cl. ............................................. 439/67; 439/325
[58] Field of Search .............................. 439/62, 67, 493, 439/325, 953

[56] References Cited

U.S. PATENT DOCUMENTS

| | | | |
|---|---|---|---|
| 4,477,133 | 10/1984 | Cosmo | 439/62 |
| 5,211,577 | 5/1993 | Daugherty | 439/67 X |
| 5,822,197 | 10/1998 | Thuault | 439/67 X |
| 5,971,773 | 10/1999 | Riddle | 439/67 |

*Primary Examiner*—Stanley J. Witkowski
*Assistant Examiner*—Mahmoud Anwav A. Mohamed
*Attorney, Agent, or Firm*—Patrick M. Griffin

[57] ABSTRACT

The connector assembly includes a housing that carries a flexible circuit member and two slide members with slide cam surfaces. A daughter board is secured to one surface on the housing and is electrically connected to the flexible circuit member. The cam surfaces on the two slide members engage cams on a mother board. Movement of the slide member cam surfaces relative to the cams on the mother board moves the housing relative to the mother board and forms an electrical connection between the flexible circuit member and the mother board. A linkage system moves both slide members to form and maintain the electrical connection between the flexible circuit member and the mother board.

3 Claims, 2 Drawing Sheets

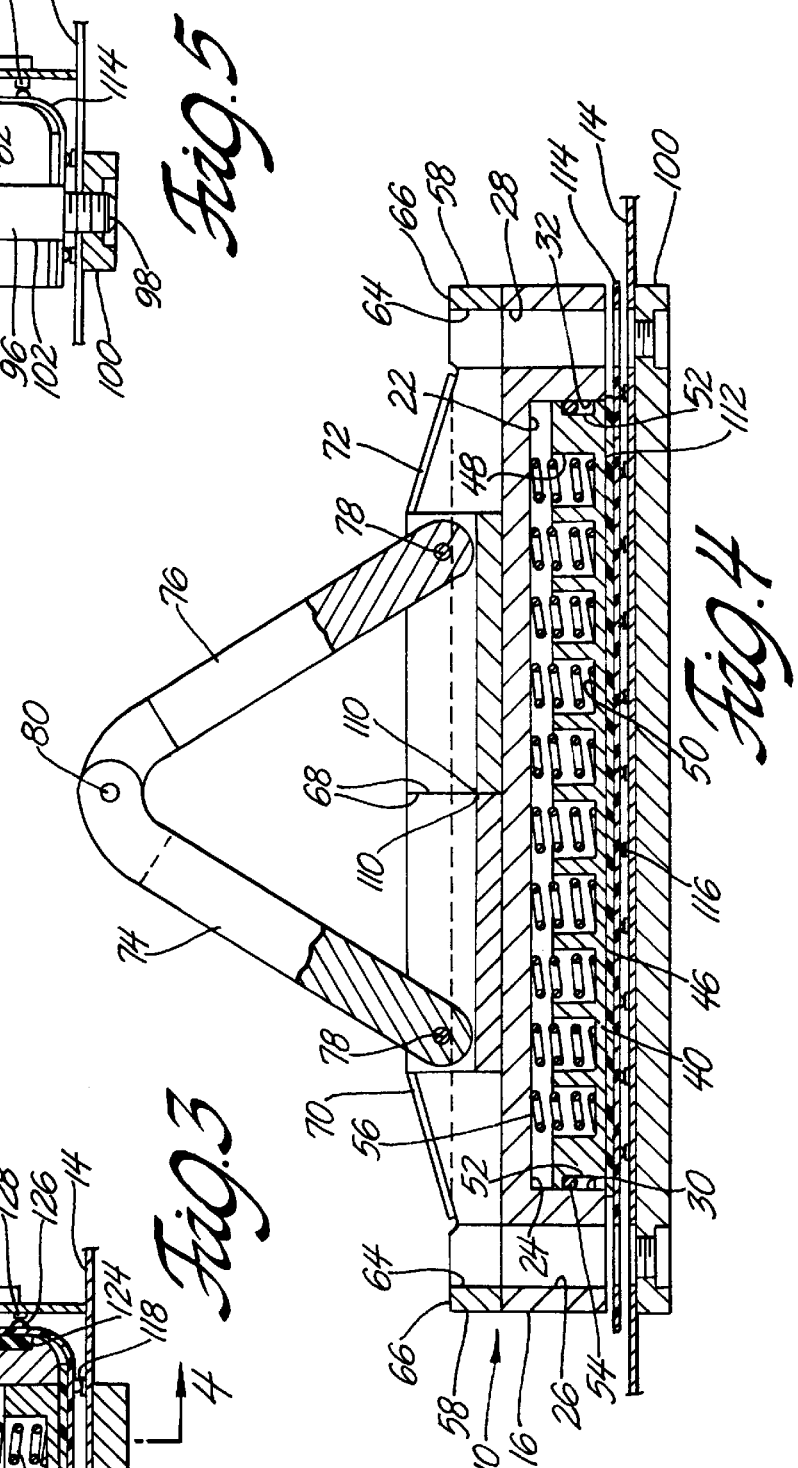

CONNECTOR ASSEMBLY

TECHNICAL FIELD

This invention relates to a connector assembly for connecting a daughter board to a back plate or motherboard with gold dot circuit connectors and more particularly to a connector assembly with low insertion or attaching force, high mechanical advantage and high holding force.

BACKGROUND OF THE INVENTION

Electrical connections between daughter boards and mother boards may be required to handle high speed signals with very high band widths and provide a large number of individual circuit connections. Gold dot electrical connectors can accommodate high speed signals, very high band widths and are capable of providing large numbers of individual circuit connections. Gold dot connections require a substantial compression force to deform the gold dots and produce a connection that is free of air gaps. When a large number of gold dot connections are made simultaneously in one connector assembly, the total compression force required is substantial. These large compression forces are generally provided by threaded fasteners. Threaded fasteners have a number of disadvantages. Tools are generally required to tighten threaded fasteners. Substantial space is required for insertion and operation of the tools. Multiple fasteners cannot be tightened simultaneously. Tightening one threaded fastener too much when another fastener is loose may damage the gold dots. It is difficult to tighten multiple threaded fasteners to a uniform tension. Vibration may loosen some threaded fasteners and overload other fasteners. All of these problems combined make it time consuming to make proper connections with connectors employing threaded fasteners. In addition to the time required, connectors with threaded fasteners require more space.

SUMMARY OF THE INVENTION

An object of the invention is to provide a connector assembly for connecting a daughter board to a mother board or back plane that has a large mechanical advantage and requires minimal space.

The connector assembly includes a housing that is secured to a daughter board. A flexible circuit member that carries an array of electrical contacts of a gold dot connector is secured to the housing and electrically connected to the daughter board. Two guide pins are secured to the motherboard. The housing has two bores which receive the pins on the motherboard and align the electrical contacts on the flexible circuit member with electrical contacts on the motherboard. A pair of slide members carried by the housing, have cam surfaces that engage conical cam surfaces on the head of each of the guide pins when the slide members move laterally relative to the housing. These cam surfaces move the housing toward the motherboard and make electrical connections between the daughter board and the motherboard.

A linkage system is connected to the slide members. This linkage system includes two lower links. Each lower link has one end pivotally attached to one of the slide members. The other ends of the lower links are pivotally attached to each other. A vertical link is pivotally attached to the ends of the lower links that are pivotally connected to each other. Movement of the vertical link downward toward the slide members moves the slide members apart, forces the housing toward the mother board and forms electrical connections between the motherboard and the flexible circuit member. Movement of the vertical member downward into contact with a stop surface moves the pivotal connection between the two lower links below a plane through the pivotal connections between each lower link and one of the slide members thereby locking the slide members and the housing to the mother board.

A resilient member between the housing and the flexible circuit member controls the pressure exerted on the gold dot connectors. The pressure exerted by the resilient member also tends to force the housing away from the mother board, urge the slide members toward each other and urge the lower links toward the stop. Urging the lower links toward the stop surface tends to retain the connection between the motherboard and the daughter board.

BRIEF DESCRIPTION OF THE DRAWINGS

The presently preferred embodiment of the invention is disclosed in the following description and in the accompanying drawings, wherein:

FIG. 3 is an enlarged sectional view taken along line 3—3 in FIG. 1;

FIG. 4 is an enlarged sectional view taken along line 4—4 in FIG. 1; and

FIG. 5 is an enlarged sectional view taken along line 5—5 in FIG. 2.

DESCRIPTION OF THE PREFERRED EMBODIMENT

Figure 1:
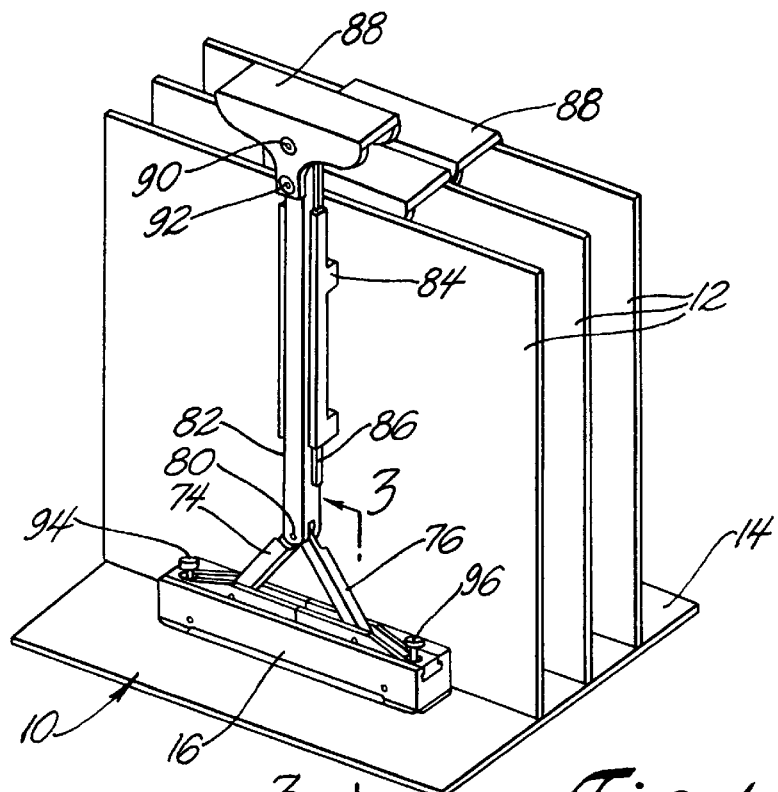
FIG. 1 is a perspective view showing two daughter boards secured to a mother board and a third daughter board in position to be secured to the mother board.
Figure 2:
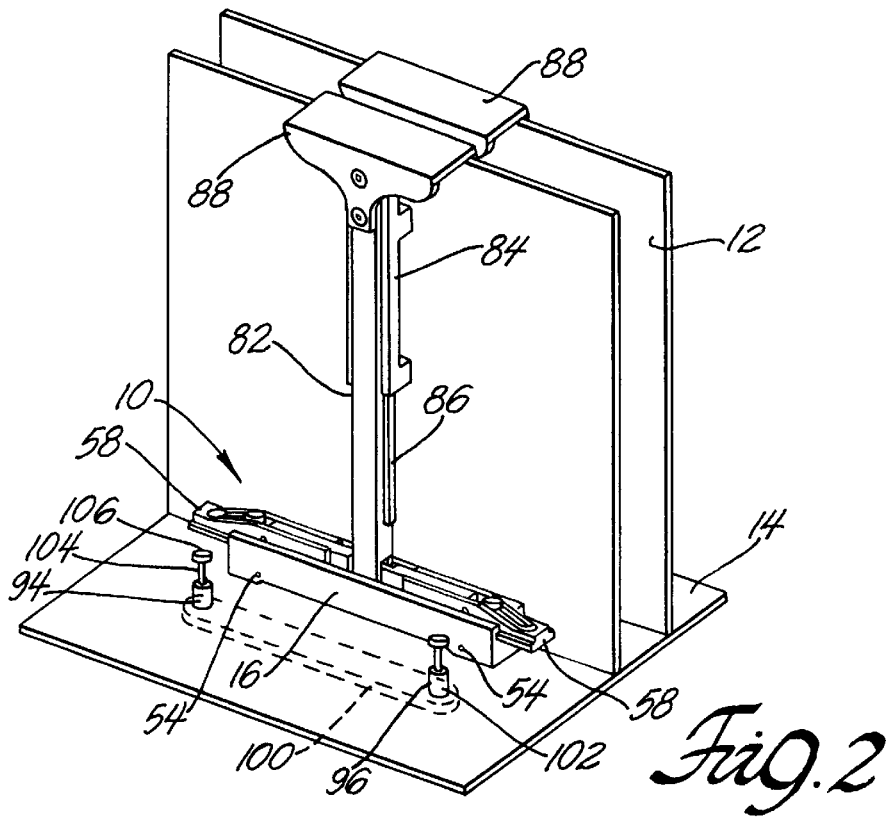
FIG. 2 is a perspective view similar to FIG. 1 with the third daughter board removed.

The terms up, down, horizontal and vertical in this application refer to components of the connector assembly as shown in the drawing. In practice the mother board can be horizontal, vertical, inclined or upside down.

The connector assembly 10 for connecting daughter boards 12 to a back plate or mother board 14 is a low insertion force high mechanical advantage connecting mechanism incorporating gold dot electrical contacts. Gold dot contacts are well known from U.S. Pat. No. 4,124,310 issued to Patrick A. Reardon, II deceased et al on Nov. 14, 1978 and U.S. Pat. No. 4,453,795 issued to Norbert L. Moulin on Jun. 12, 1984, both of which are incorporated into this patent specification by reference.

The connector assembly 10 includes a housing 16 that is secured to the daughter board 12 by threaded fasteners 18. The fasteners 18 pass through a stiffener bar 20 and the daughter board 12 and screw into threaded bores in the housing 16. Electrical connections between the circuits carried on the daughter board 12 and the connector assembly 10 are described below.

The housing 16 has a pressure plate cavity 22 in its lower portion. The base surface 24 of the cavity 22 is a spring abutment surface. Alignment pin bores 26 and 28 pass through each end of the housing 16 in positions spaced from the end walls 30 and 32 of the cavity 22 and outside of the cavity. A slide slot 34 is provided in an upper portion of the housing 16. The slot 34 has side grooves 36 and 38 that formguide tracks extending the length of the housing 16.

A pressure plate 40 fits in the pressure plate cavity 22. The end walls 30 and 32 and side walls 42 and 44 of the cavity 22 horizontally restrain the pressure plate 40 while leaving the plate free to move vertically. The pressure plate has a solid flat bottom surface 46 with a plurality of compression spring chambers 48 that are open at the top. Each chamber 48 has a spring engagement surface 50. The surface 50 can be a flat surface for engaging ground spring ends or it can be a shaped surface that conforms to a spring end surface. A groove 52 is provided in each end of the pressure plate 40. A pin 54 passes through the housing 16 and each of the grooves 52. The pin 54 retains the pressure plate 40 in the pressure plate cavity 22. However the pins 54 permit limited vertical movement of the pressure plate 40 relative to the housing 16.

A compression spring 56 is retained in each compression spring chamber 48. These springs 56 are preloaded between the spring engagement surface 50 on the pressure plate 40 and the base surface 24 of the cavity 22 in housing 16. The springs 56 urge the pressure plate in a downward direction and control the maximum pressured exerted on gold dot contacts.

Two slide members 58 are mounted in the slide slot 34 in the upper portion of the housing 16. Since these slide members 58 are identical, only one will be described. Each slide member 58 has side flanges 60 and 62 that are received in the side grooves 36 and 38 of the slot 34 and limit movement of both slide members to movement along a line parallel to a long axis of the slot. A vertical bore 64 through the outboard end 66 of each slide member 58 is aligned with an alignment pin bore 26 or 28 when both of the slide members are retracted into the slot 34. As shown in the drawing, the inboard ends 68 of both slide members 58 are in contact with each other when both slide members are retracted into the slide slot 34. The slide members 58 could be somewhat shortened if desired. If the slide members are shorter, the end board ends 68 could contact stop surfaces connected to the housing 16. Such stop surfaces could, for example, be a pin or pins that extend into the slide slot 34.

Cam surfaces 70 and 72 are provided on the out board end 66 of each slide member 58. These cam surfaces 70 and 72 start at the vertical bore 64 and extend toward the inboard end 68 and vertically up from the side flanges 60 and 62. A slot 73 between the cam surfaces 70 and 72 has a width that is less than the diameter of the bore 64. The function of the surfaces 70 and 72 is explained below.

Bottom links 74 and 76 of an upside down Y-linkage are pivotally attached to the slide members 58 by a pin 78. The pin 78 as shown is about midway between the out board end 66 and the inboard end 68 and well above the side flanges 60 and 62. The inboard ends of links 74 and 76 are pivotally attached to each other by a pin 80. The pine 80 also pivotally attaches the upper vertical link 82 of the upside down Y-linkage to the inboard end of the links 74 and 76. A rail 84, attached to the daughter board 12 by threaded fasteners, has vertical slots that receive flanges 86 on both sides of the vertical link 82. Engagement of the flanges 86 and the vertical slots in the rail 84 limits the vertical link 82 to vertical movement relative to the horizontal slide slot 34 in the housing 16. A handle 88 is rigidly secured to the upper end of the vertical link 82 by fasteners 90 and 92.

Two guide pins 94 and 96 have threaded studs 98 on their lower ends that extend through bores through the motherboard 14. The threaded studs 98 screw into a stiffener bar 100 on the bottom side of the motherboard 14 and clamp the stiffener bar in place. The pins 94 and 96 have a cylindrical guide portion 102, a reduced diameter shank portion 104 and a head 106 that is the same diameter as the guide portion 102. The head 106 has a downwardly facing conical cam surface 108.

To attach the daughter board 12 to the motherboard 14, the alignment pin bores 26 and 28 in the housing 16 are aligned with the guide pins 94 and 96. The housing 16 is then moved vertically toward the motherboard 14 and the guide pins 94 and 96 are received in the alignment pin bores 26 and 28. The cylindrical guide portions 102 fill the alignment pin bores 26 and 28 and horizontally position the daughter board 12 relative to the motherboard 14. The shank portions 104 pass up through the vertical bores 64 through the slide members 58 and hold the heads 106 and the conical can surfaces 108 above the vertical bores. This is the position of the front daughter board 12 shown in FIG. 1. The handle 88 is then manually forced downward. Moving the handle 88 and the vertical link 82 downward moves the pin 80 downward and forces the slide members 58 apart. As each slide member moves outwardly, the reduced diameter shank portion 104 of each of the guide pins 94 and 96 is received in one of the slots 73 and the conical cam surface 108 contacts the inclined cam surfaces 70 and 72 on the adjacent slide member 58. Further downward movement of the handle 88 forces the slide members 58 further apart and the cam surfaces 70 and 72 cooperate with the conical cam surface 108 to move the housing 16 vertically downward and compresses the springs 56. The handle 88 moves a few inches to move the housing 16 a fraction of an inch vertically thereby providing a large mechanical advantage.

The pivot pin 80 moves below a plane through the two pins 78 when the slide members 58 reach their positions of maximum separation between their inboard ends 68. A slight additional movement of the pivot pin 80 below the plane through the pins 78 permits the housing 16 to raise slightly and the springs 56 to force the handle 88 downward. Downward movement of the handle 88 stops when the bottom links 74 and 76 contact surfaces 110 on the slide members 58 adjacent to the ends 68. Alternatively, downward movement of the pivot pin 80 could be stopped by contact between the links 74 and 76 and the bottom of the slot 34. When the pivot pin 80 is in its lowest position, the springs 56 bias the handle 88 downward and lock the daughter board 12 to the motherboard 14.

The daughter board 12 is released from the motherboard 14 by applying an upward force on the handle 88. The force required to lift the handle 88 is substantially the same as the force required to force the handle 88 to the locked position. As the pivot pin 80 passes up through the plane through the pins 78, the springs 56 exert an upward force on the vertical link 82 through the two bottom links 74 and 76. After the springs 56 have moved the pressure plate 40 into contact with the pins 54 in the housing 16, the handle 88 can be raised manually thereby moving the inboard ends 68 of the slide members 58 into contact with each other as shown in FIG. 1. The housing 16 can then be lifted from the guide pins 94 and 96.

An elastomeric cushion 112 shown in FIG. 3 is connected to the flat bottom surface of a pressure plate 40. A flexible circuit member 114 is connected to the housing 16 and the elastomeric cushion 112. An array of gold dot contacts 116 are attached to the portion of the flexible circuit member 114 that is under the pressure plate 40. Each of the gold dot contacts 116 on the flexible circuit member 114 is aligned with a contact pad 118 on the motherboard 14 by the pins 94 and 96.

The flexible circuit member 114 is an L-shaped member with a portion that is adjacent to a vertical side 120 of the housing 16. An elastomeric pad 122 is mounted in a recess 124 in the vertical side 120 of the housing 16. An array of gold dot contacts 126 are mounted on the side of the flexible circuit member 114 facing the daughter board 12. Each of these gold dot contacts 126 is aligned with a contact pad 128 on the daughter board 12. Threaded fasteners 18 pass through the stiffener bar 20 and the daughter board 12 and clamp the housing 16 to the daughter board. The elastomeric pad 122 controls the pressure on each gold dot contact 126. Since the connection between the housing 16 and the daughter board 12 is a permanent connection, a pressure plate and compression springs are not required. However a pressure plate and compression springs could be used to control the pressure on the gold dots connecting the flexible circuit member 114 to the daughter board 12.

The gold dot connections between the flexible circuit member 114 and the daughter board 12 can be replaced by soldered connections if desired since these connections are permanent. It is not contemplated that the housing 16 will be removed from the daughter board 12. However, the connection between the daughter board 12 and the flexible circuit member 114 can be modified to include a pressure plate and compression springs if the connection is not to be permanent.

The disclosed embodiment is representative of a presently preferred form of the invention, but is intended to be illustrative rather than definitive thereof. The invention is defined in the claims.

What is claimed is:

1. A connector assembly comprising:

a housing having at least two alignment pin passages;

a resilient member carried by said housing;

a first slide member slideably attached to said housing and having a first slide cam surface;

a second slide member slideably attached to said housing and having a second slide cam surface;

a flexible circuit member attached to said housing and to said resilient member;

a first guide pin received in one of the at least two alignment pin passages and a first pin guide portion and a first pin cam surface, connected to a mother board;

a second guide pin received in the other one of the at least two alignment pin passages and having a second pin guide portion and a second pin cam surface, connected to the mother board;

a linkage system including a first bottom link pivotally attached to said first slide member, a second bottom link pivotally attached to the second slide member and to the first bottom link and wherein the first and second bottom links hold the first slide cam surface in contact with the first pin cam surface and urge said housing toward the mother board, hold the second slide cam surface in contact with the second pin cam surface and urge said housing toward the mother board thereby compressing said resilient member and forming a plurality of electrical circuits between the flexible circuit member and the mother board and wherein the resilient member urges the first bottom link and the second bottom link toward at least one stop surface thereby locking the housing to the mother board.

2. A connector assembly as set forth in claim 1 including a handle connected to the linkage system that is operable to pivot the first bottom link and the second bottom link away from the stop, move the first and second slider cam surface from contact with the first pin cam surface and the second pin cam surface.

3. A connector assembly comprising:

a housing having a first side, a second side, a pressure plate cavity bottom wall, at least two alignment pin passages in said housing and a slide slot;

a pressure plate received in the pressure plate cavity and having a solid surface facing away from the pressure plate cavity; and a plurality of compression spring chambers;

a plurality of compression springs each of which is mounted in one of the compression spring chambers and is in contact with the pressure plate cavity bottom wall;

at least two retainers that limit movement of said pressure plate out of the pressure plate cavity and preload said compression springs;

a first slide member, having a first slide cam surface, mounted in the slide slot, a second slide member, having a second slide cam surface, mounted in the slide slot;

a flexible circuit member carried by said housing and having a first portion adjacent to the solid surface of the pressure plate and a second portion adjacent to a second side of said housing;

a daughter board secured to the second side of said housing and electrically connected to said flexible circuit member;

a first guide pin having a first pin guide portion and a first pin cam surface connected to a mother board and wherein said first guide pin is received in one of the at least two guide pin passages in said housing;

a second guide pin having a second pin guide portion and a second pin cam surface connected to the mother board and wherein said second guide pin is received in another one of the at least two guide pin passages in said housing and wherein said first and second guide pins align a plurality of dots with a plurality of pads carried by said flexible circuit member in said mother board; and a linkage system including a first bottom link pivotally attached to said first slide member, a second bottom link pivotally attached to the second slide member and to the first bottom link and a vertical link pivotally attached to the first bottom link and the second bottom link and wherein vertical movement of the vertical link is operable to move the first slide pin surface into contact with the first pin cam surface and urge said housing toward the mother board, to move the second slide cam surface into contact with the second pin cam surface and urge said housing toward the mother board and to simultaneously compress said compression springs and form a plurality of electrical circuits.

* * * * *